(12) United States Patent
Petrin et al.

(10) Patent No.: US 7,081,710 B2
(45) Date of Patent: Jul. 25, 2006

(54) ELEMENTARY PLASMA SOURCE AND PLASMA GENERATION APPARATUS USING THE SAME

(75) Inventors: Andrei-B. Petrin, Yongin-si (KR);
Jai-Kwang Shin, Anyang-si (KR);
Jae-Joon Oh, Seongnam-si (KR);
Seong-Gu Kim, Pyeongtaek-si (KR);
Ji-Hyun Hur, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 81 days.

(21) Appl. No.: 10/844,804

(22) Filed: May 13, 2004

(65) Prior Publication Data

US 2005/0001554 A1   Jan. 6, 2005

(30) Foreign Application Priority Data

Jul. 3, 2003   (KR) .................... 10-2003-0044894

(51) Int. Cl.
*H01J 7/24* (2006.01)
(52) U.S. Cl. ................... 315/111.41; 118/723 MA
(58) Field of Classification Search ........... 315/111.21, 315/111.41; 118/723 MW, 723 MA; 156/345.35, 156/345.36, 345.37, 345.41
See application file for complete search history.

(56) References Cited

U.S. PATENT DOCUMENTS

| | | | | |
|---|---|---|---|---|
| 5,133,825 A | * | 7/1992 | Hakamata et al. ...... | 156/345.42 |
| 5,262,028 A | * | 11/1993 | Manley ................. | 204/192.12 |
| 5,415,754 A | * | 5/1995 | Manley ................. | 204/192.12 |
| 5,429,070 A | * | 7/1995 | Campbell et al. ........ | 118/723 R |
| 6,332,947 B1 | * | 12/2001 | Ichimura et al. ........ | 156/345.42 |
| 6,440,282 B1 | * | 8/2002 | Wada et al. ............. | 204/298.2 |
| 6,803,590 B1 | * | 10/2004 | Brailove et al. ........ | 250/492.22 |
| 2003/0101936 A1 | * | 6/2003 | Lee ........................ | 118/723 E |
| 2003/0178229 A1 | * | 9/2003 | Shin et al. .............. | 204/298.2 |

\* cited by examiner

*Primary Examiner*—Thuy Vinh Tran
(74) *Attorney, Agent, or Firm*—Dilworth & Barrese LLP

(57) ABSTRACT

An elementary plasma source for generating plasma is provided. In the elementary plasma source, first and second magnets are shaped like a hollow cylinder, and the second magnet surrounds the first magnet, for forming a magnetic trap between the first and second magnets. A guide provides microwaves to a space between the first and second magnets.

8 Claims, 7 Drawing Sheets

ELEMENTARY PLASMA SOURCE AND PLASMA GENERATION APPARATUS USING THE SAME

PRIORITY

This application claims priority under 35 U.S.C. § 119 to an application entitled "Elementary Plasma Source and Plasma Generation Apparatus Using the Same" filed in the Korean Intellectual Property Office on Jul. 3, 2003 and assigned Serial No. 2003-44894, the contents of which are incorporated herein by reference.

BACKGROUND OF THE INVENTION

1. Field of the Invention

The present invention relates generally to a plasma generation apparatus, and in particular, to an Electron Cyclotron Resonance (ECR) based plasma generation apparatus.

2. Description of the Related Art

Various types of ECR-based plasma generation apparatuses have been proposed in recent years. Among them, there are a plasma generation apparatus using a strip bar-type antenna and a plasma generation apparatus using multiple annular antennas.

None of existing plasma generation apparatuses can generate plasma in a wide range and control a plasma distribution freely. Although elementary plasma sources arranged without interference between each other are needed to do so, the existing plasma generation apparatuses cannot implement these elementary plasma sources.

SUMMARY OF THE INVENTION

It is, therefore, an object of the present invention to provide elementary plasma sources which can be arranged without interference between each other and a plasma generation apparatus for generating plasma over a wide area and freely controls plasma distribution.

The above object is achieved by an elementary plasma source and a plasma generation apparatus using the same.

In the elementary plasma source, first and second magnets are shaped like a hollow cylinder, and the second magnet surrounds the first magnet, for forming a magnetic trap between the first and second magnets. A guide provides microwaves to the space between the first and second magnets.

In the plasma generation apparatus a plurality of elementary plasma sources are arranged. Each of them has a first hollow cylinder-shaped magnet, a second hollow cylinder-shaped magnet positioned around the first magnet, for forming a magnetic trap between the first and second magnets, and a guide for providing microwaves to the space between the first and second magnets. At least one power splitter splits the power of microwaves applied to an input terminal and outputs the split powers to output terminals, thereby distributing the microwaves to the elementary plasma sources.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
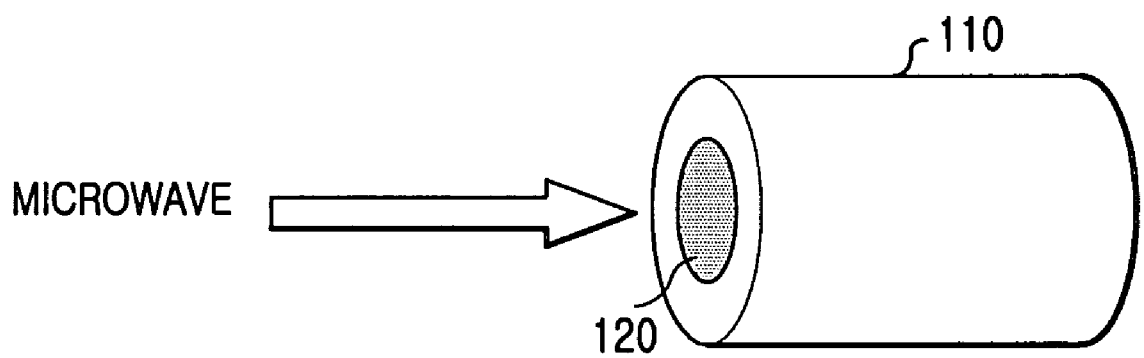
FIG. 1 is a perspective view illustrating a hollow cylinder-like permanent magnet.

FIG. 1 is a perspective view illustrating a permanent magnet 110, to which the present invention is applied. The permanent magnet 110 is rotation-symmetrical with respect to a magnetization axis and shaped into a hollow cylinder having a bore 120 at the center. With a microwave frequency of 2.45 GHz, a magnetic force strength required for Electron Cyclotron Resonance (ECR) is $875 \times 10^{-4}$ T. The permanent magnet 110 shown in FIG. 1 is preferably 30 mm long, and outer and inner diameters of the permanent magnet 110 are preferably 20 mm and 6 mm, respectively.

Figure 2A:
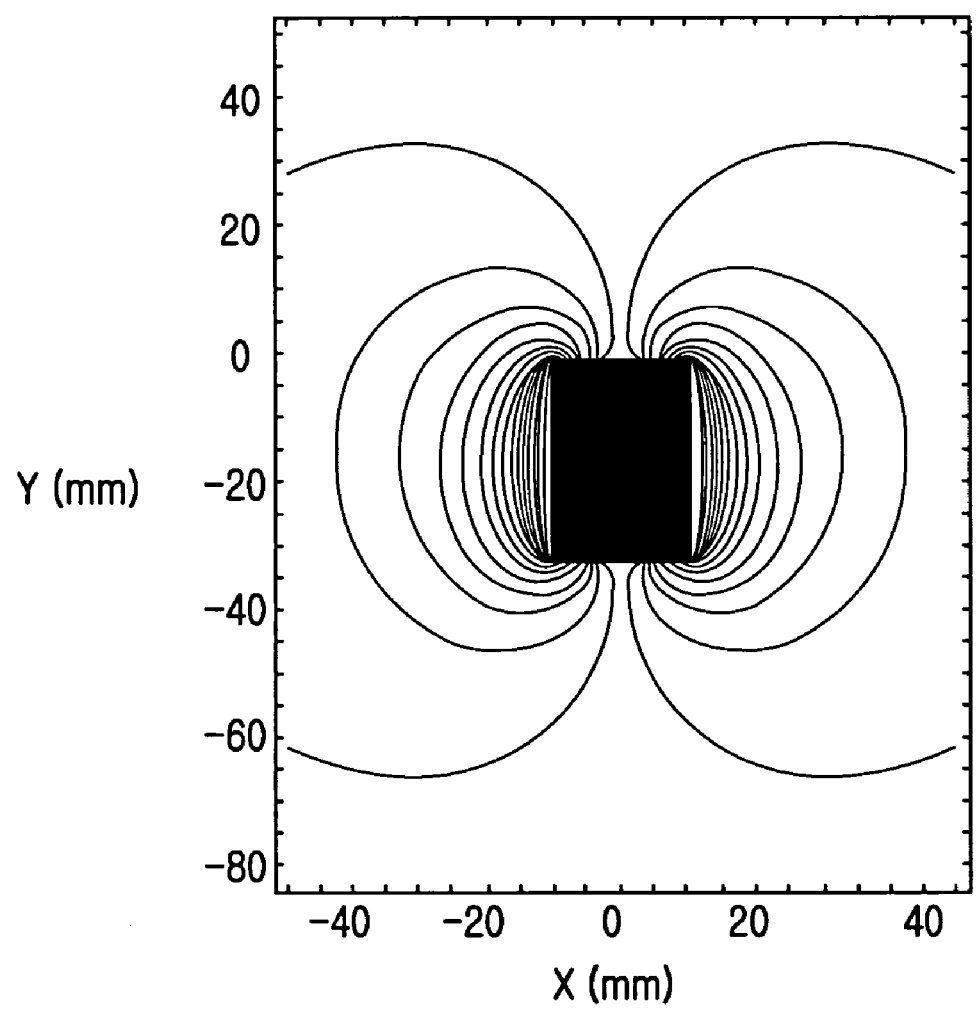
FIG. 2A is a graphical representation illustrating the magnetic field of the permanent magnet illustrated in FIG. 1.
Figure 2B:
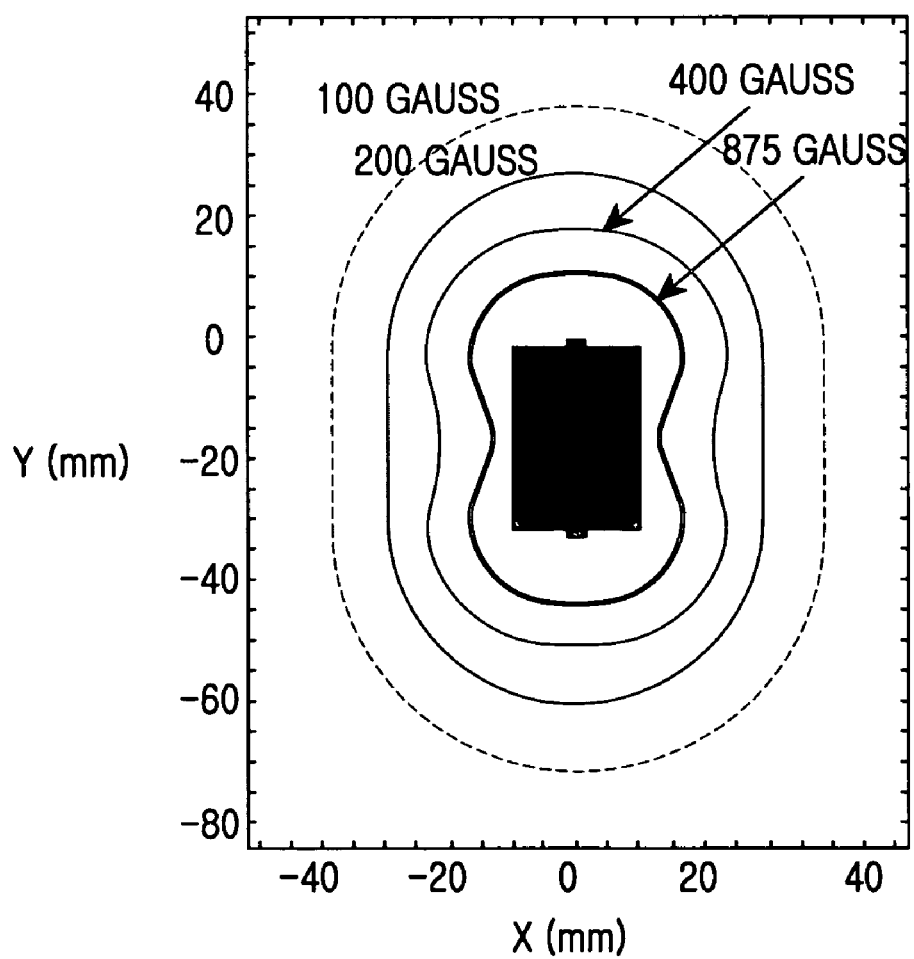
FIG. 2B is a graphical representation illustrating the isogam of the permanent magnet illustrated in FIG. 1.

FIG. 2A is a graphical representation illustrating the magnetic field of the permanent magnet illustrated in FIG. 1, while FIG. 2B is a graphical representation illustrating the isogam of the permanent magnet illustrated in FIG. 1. Referring to FIG. 2B, a line of equal magnetic force, 875 G corresponding to an ECR coupling region is nearest to the permanent magnet 110. The electric field of microwaves applied through the bore 120 of the permanent magnet 110 accelerates electrons in the ECR coupling region, thus creating a plasma. These fast electrons are vibrated within an area defined by two magnetic force lines and two mirror points before both poles of the permanent magnet 110, and rotate around the permanent magnet 110 as in a tri-dimensional magnetron. In the region, an Electron Energy Distribution Function (EEDF) is considered as the sum of the densities of hot electrons and cold electrons, which have Maxwellian distribution functions. The temperature of the hot electron density can be higher than 17 eV. Much of the hot electron density contains electrons having twice as high an energy as 17 eV. Inelastic collisions between these electrons give rise to a plasma and the plasma is diffused away from the permanent magnet 110. Fast electrons are trapped within magnetic force lines, while only the cool electrons are diffused away from the magnetic field under the influence of density gradients and a generated space electric field.

Preferably, an ECR plasma generated from an elementary plasma source according to the present invention is kept within a magnetic trap, and the strength of a magnetic field near to the boundary of the magnetic trap has a resonance value.

Figure 3:
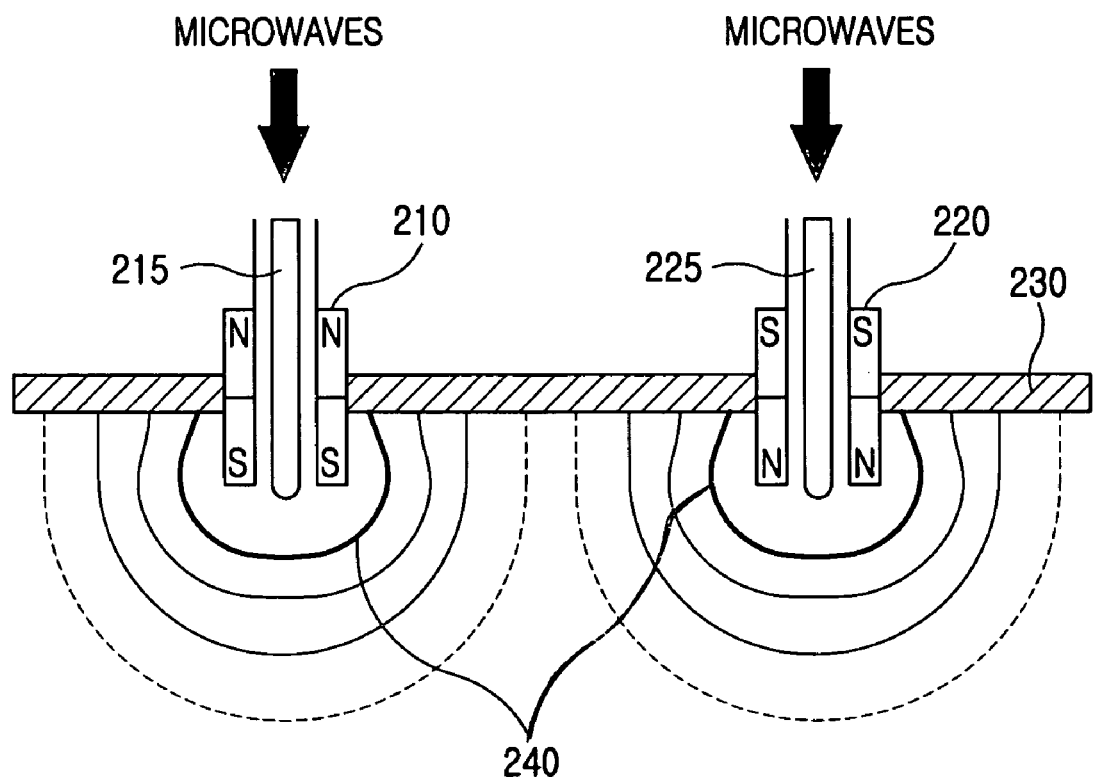
FIG. 3 is a schematic representation illustrating the principle of creating a magnetic trap according to the present invention.

FIG. 3 is a schematic representation illustrating the principle of generating a magnetic trap according to the present invention. First and second permanent magnets 210 and 220 shown in FIG. 3 are mounted in a metal plate 230, with opposite poles positioned downward. Each of the first and second permanent magnets 210 and 220 is a hollow cylinder rotation-symmetrical with respect to a magnetization axis. The magnetic trap is formed between the first and second permanent magnets 210 and 220.

Figure 4:
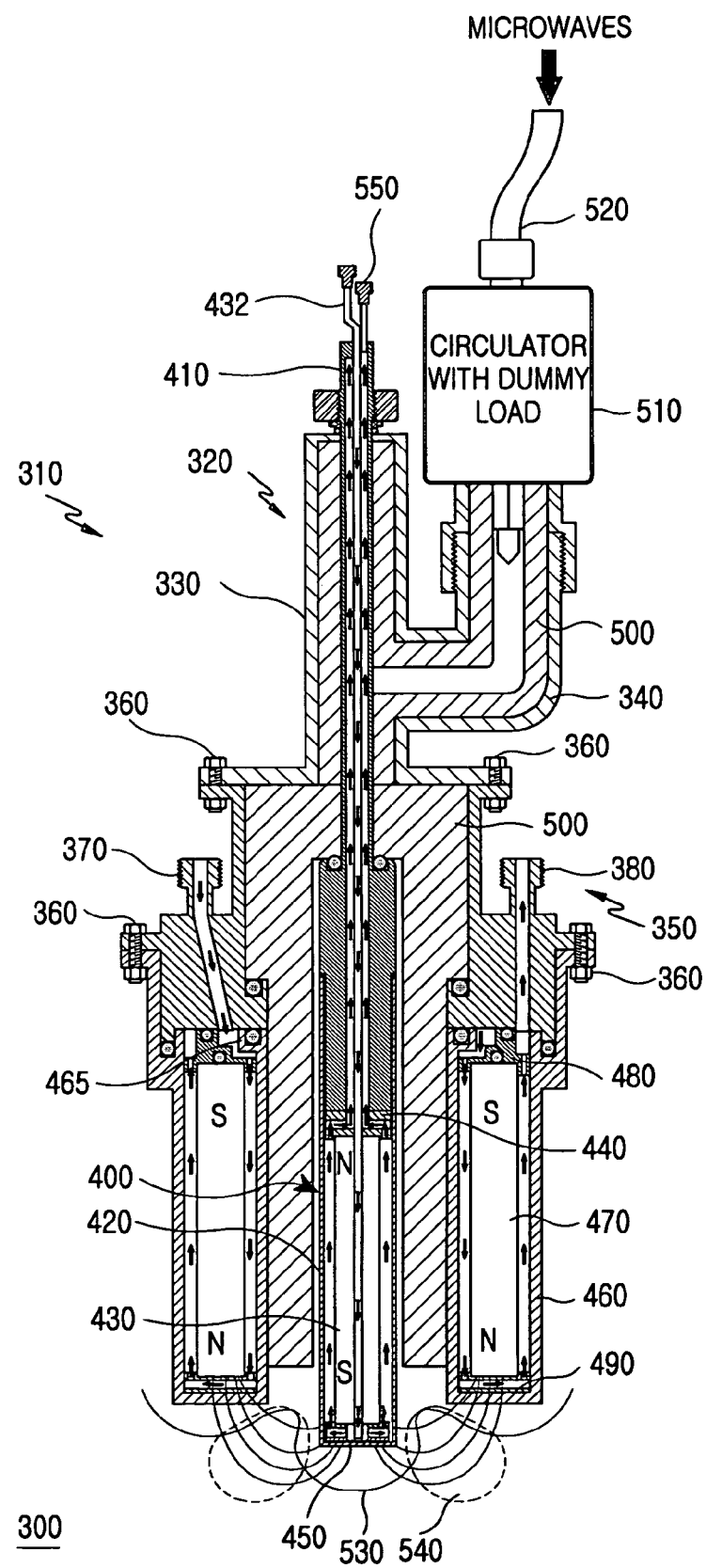
FIG. 4 is a cross-sectional view illustrating the structure of an elementary plasma source according to a preferred embodiment of the present invention.

FIG. 4 illustrates the structure of an elementary plasma source according to a preferred embodiment of the present invention. The elementary plasma source shown in FIG. 4 includes a housing 310, first and second chambers 400 and 460, a guide 500, and first and second permanent magnets 430 and 470.

The housing 310 includes a first subhousing 320 and a second subhousing 350 secured to the first subhousing 320. The first subhousing 320 has a hollow cylinder-like body 330 having a first bore (not shown), and a guide pipe 340 extending from a sidewall of the body 330, communicating with the first bore. The body 330 has an opening formed at the top thereof and is opened at the bottom thereof. The bottom of the body 330 extends radially, for connecting to the second subhousing 350. The second subhousing 350 is shaped like a hollow cylinder having a second bore (not shown). An opening at the top of the second subhousing 350 communicates with the first bore, and the bottom of the second subhousing 350 is opened. The top of the second subhousing 350 extends radially, for connection to the first subhousing 320. The bottom of the first subhousing 320 preferably is fixed to the top of the second subhousing 350 by fasteners 360 such as bolt-nut pairs. A lower portion of the second subhousing 350 extends radially, for connection to the second chamber 460. A water inlet 370 and a water outlet 380 penetrate in the extended portion of the second subhousing 350.

The first chamber 400, is inserted into the first and second bores of the housing 310, penetrating the housing 310. A tube 410 is positioned in an upper portion of the housing 310, and a hollow cylinder 420 is positioned in a lower portion of the first chamber 400. The tube 410 partially protrudes upward from the top of the housing 310 and has a water supply line 432 and a water discharge line 550 at the top of the tube 410, with the bottom of the tube 410 opened. The tube 410 is preferably thicker in its lower portion than in its upper portion and has an annular groove at a bent portion of the tube 410. A rubber ring is inserted in the annular groove. The cylinder 420 is opened at the top and closed at the bottom. The top of the cylinder 420 is fixedly inserted into the bottom of the tube 410. A rubber ring is inserted between a bent portion of the outer circumference of the tube 410 and the top of the cylinder 420, thereby providing an airtight connection.

The first permanent magnet 430 is held in the cylinder 420. The first permanent magnet 430 is shaped into a hollow cylinder having a bore at its center. A water supply line 432 extends from the top of the first chamber 400 to the bottom of the first permanent magnet 430, through the bore of the magnet 430, for supplying cooling water. A first window 440 is intervened between the top of the first permanent magnet 430 and the bottom of the tube 410. A second window 450 is intervened between the bottom of the first permanent magnet 430 and the inner bottom surface of the cylinder 420. The first and second windows 440 and 450 are annular around the water supply line 432 and have a plurality of holes on their inner walls and bottom/top surfaces. Water is introduced from the upper end of the water supply line 432 and flows downward. Passing through the inner side holes and the top holes of the second window 450, the cooling water goes upward along between the inner wall of the cylinder 420 and the outer circumferential surface of the first permanent magnet 430. The cooling water is then discharged upward along between the inner wall of the tube 410 and the outer circumferential surface of the coaxial water supply line 432, sequentially passing through the bottom holes, inner side holes, and central hole of the first window 440. Finally, the cooling water comes into a water discharge line 550 through the water outlet of the tube 410.

The second chamber 460 is positioned around the first chamber 400, thus defining an annular space. The top of the second chamber 460 extends upward in correspondence with the extended portion of the second subhousing 350, for connecting to the second subhousing 350. The extended portions of the second chamber 460 and the second subhousing 350 are fixed to each other by fasteners 360 such as bolt-nut pairs, and the annular space is opened upward. A mounting portion 465 extends from the inner sidewall of the second chamber 460 to an upper portion of the second chamber 460. A rubber ring is inserted in the mounting portion 465, thereby improving airtightness.

The hollow cylinder-shaped second permanent magnet 470 is loaded in the second chamber 460, with an opposite pole from the lower pole of the first permanent magnet 110 positioned downward. A third window 480 is interposed between the top of the second permanent magnet 470 and the bottom of the second subhousing 350, and a fourth window 490 is interposed between the bottom of the second permanent magnet 470 and the inner bottom surface of the second chamber 460. The third window 480 is annular, having a circular step around a circular hole. A plurality of holes are formed on the inner and outer circumferential edges of the step of the third window 480. A groove is formed on the step and another groove on the bottom of the window 480 under the groove. Rubber rings are inserted in the grooves, improving airtightness. The fourth window 490 is annular and hollow in its inside. It has holes at the inner and outer circumferential edges of the top surface of the fourth window 490. The water inlet 370 of the second subhousing 350 communicates with the inner circumferential holes of the third window 480, and the water outlet 380 of the second subhousing 350 communicates with the outer circumferential holes of the third window 480. Cooling water is injected through the water inlet 370, flows along between the inner surface of the second permanent magnet 470 and the inner circumferential-inner wall of the second chamber 460. The fourth window 490 discharges the cooling water introduced through its inner circumferential holes through its outer circumferential holes. The cooling water then flows along between the outer surface of the second permanent magnet 470 and the outer circumferential-inner wall of the second chamber 460 and the third window 480 discharges the cooling water introduced through its outer circumferential holes into the water outlet 380 of the second subhousing 350.

The guide 500 is positioned between the inner wall of the housing 310 and the first chamber 400, for providing microwaves to the space between the first and second permanent magnets 430 and 470. That is, the guide 500 is disposed in the first and second holes of the housing 310 and the guide pipe 340. The guide 500 occupies the empty space of the second bore of the housing 310 to improve airtightness. An annular groove is also formed on the bent inner wall of the second housing 350 and a rubber ring is inserted in the groove, thereby improving airtightness.

A circulator 510 is connected to the guide 500 to block reflected microwaves, and transfers microwave power applied to a dummy load 520 to the guide 500.

An ECR coupling region 530 is formed by the elementary plasma source 300 and a plasma 540 is trapped within a magnetic trap between the first and second permanent magnets 430 and 470. The guide 500 provides the microwave power to the magnetic trap without loss and the plasma 540 is kept by the microwaves. The microwaves are not absorbed in the plasma 540 before the microwaves reach the ECR coupling region 530 or are radiated to another adjacent elementary plasma source. Consequently, there is no interference between elementary plasma sources.

Elementary plasma sources 300 as illustrated in FIG. 4 can be arranged in various patterns to form a plasma generation apparatus. Since the magnetic trap is confined to one elementary plasma source 300, each elementary plasma source 300 operates independently. This plasma generation apparatus facilitates a plasma distribution over a wide area. Furthermore, there is no need to consider the distance between elementary plasma sources 300 in the apparatus.

The elementary plasma source 300 is designed such that the distance between a microwave generator (not shown) and the bottom of the guide 500 is about ¼ of a microwave wavelength considering the dielectric constant of the guide 500, and the distance between the bottom of the guide 500 and the plasma 540 is about a ¾ of the wavelength.

Hereinbelow, apparatuses implemented with a plurality of elementary plasma sources 300 will be described with reference to FIGS. 5 and 6. Since a single elementary plasma source 300 as shown in FIG. 4 has been described above in detail, its description is not provided here.

Figure 5:
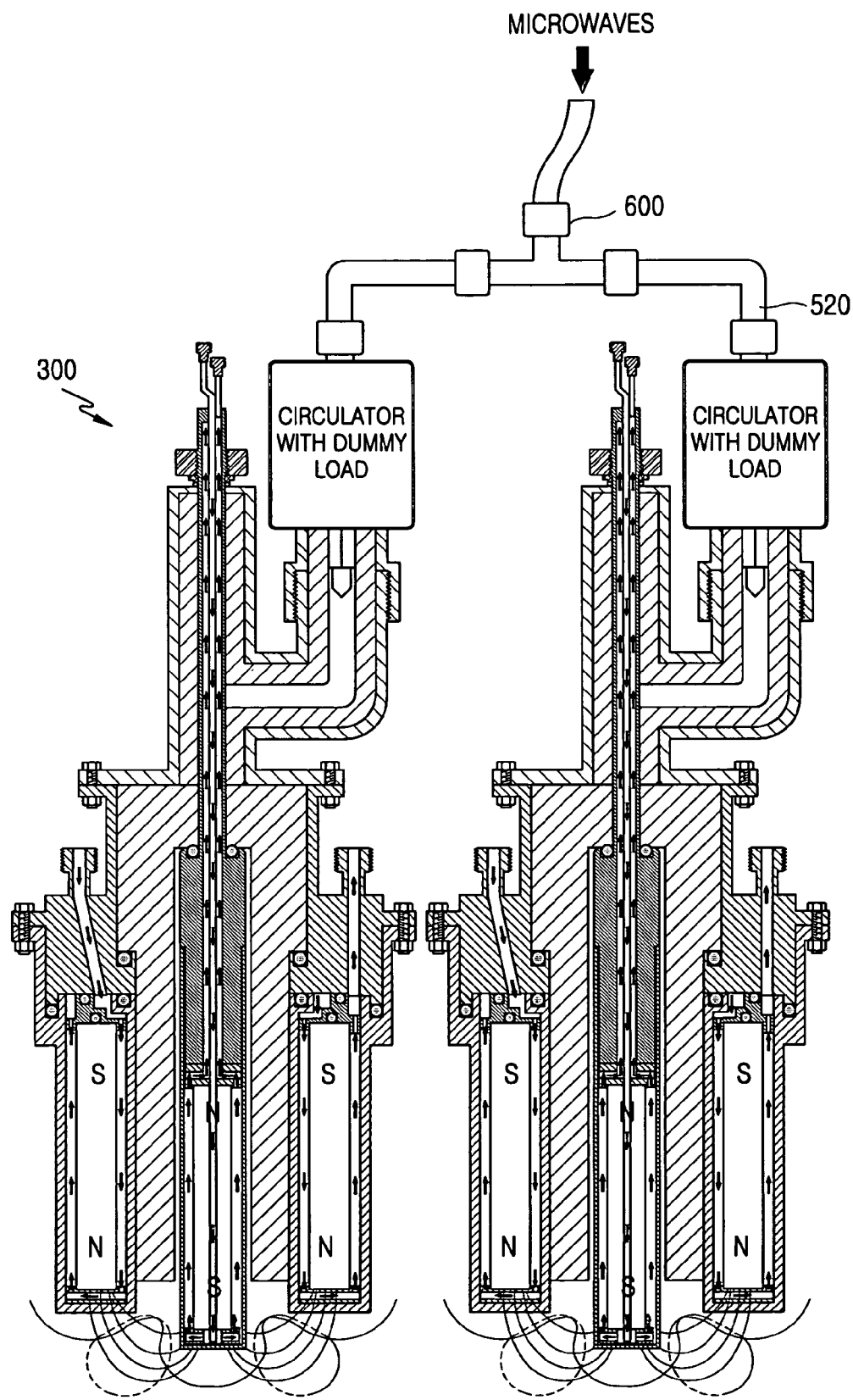
FIG. 5 is a cross-sectional view illustrating a plasma generation apparatus using two elementary plasma sources according to the present invention.

FIG. 5 illustrates a plasma generation apparatus using two elementary plasma sources 300. A T-type power splitter 600 is used to provide microwave power to the elementary plasma sources 300. The T-type power splitter 600 splits microwave power applied to its input terminal and outputs the split microwave powers to its two output terminals connected to the two elementary plasma sources 300.

Figure 6:
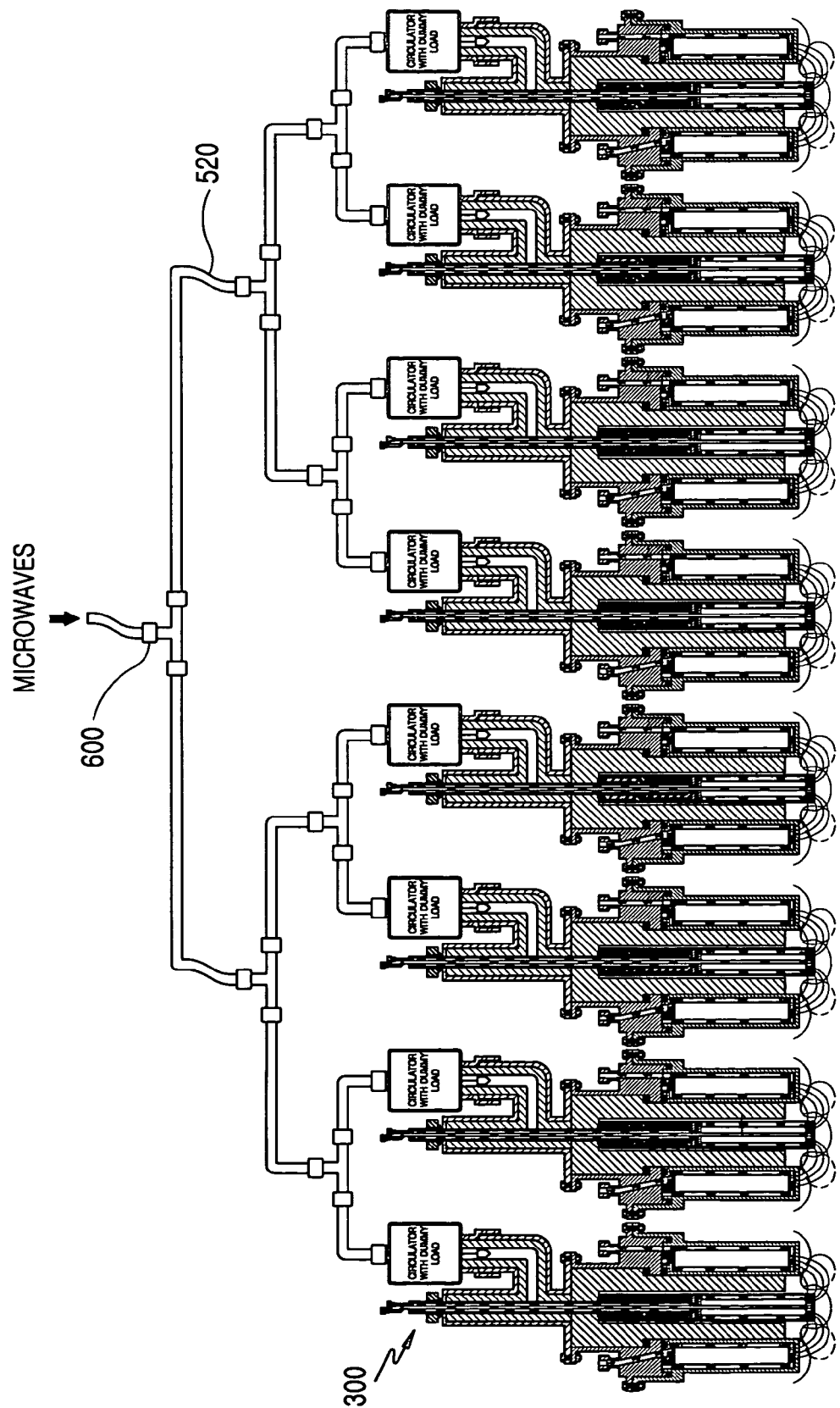
FIG. 6 is a cross-sectional view illustrating a plasma generation apparatus using eight elementary plasma sources according to the present invention.

FIG. 6 illustrates a plasma generation apparatus using eight elementary plasma sources 300. A plurality of T-type power splitters 600 are used to provide microwave power to the elementary plasma sources 300. These T-type power splitters 600 are connected to each other in a tree structure.

As described above, the inventive elementary plasma source creates a magnetic trap independently. Therefore, a plurality of elementary plasma sources can be arranged without interference between each other, and thus generate plasma over a wide area. Also, plasma distribution can be controlled freely.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An elementary plasma source for generating a plasma, comprising:
   a first hollow cylinder-shaped magnet;
   a second hollow cylinder-shaped magnet positioned around the first magnet, for forming a magnetic trap between the first and second magnets; and
   a guide for providing microwaves to a space between the first and second magnets.

2. The elementary plasma source of claim 1, further comprising water passages surrounding the first and second magnets for flowing cooling water along inner and outer circumferential surfaces of the first and second magnets.

3. An elementary plasma source for generating a plasma, comprising:
   a housing having openings at a top and bottom of the housing;
   a first chamber within the housing;
   a first hollow cylinder-shaped magnet located in the first chamber;
   a second chamber around the first chamber;
   a second hollow cylinder-shaped magnet located in the second chamber, for forming a magnetic trap between the first and second magnets; and
   a guide positioned between an inner wall of the housing and the first chamber, for providing microwaves to a space between the first and second magnets.

4. The elementary plasma source of claim 3, further comprising a water supply line extending from a top of the first chamber to a bottom of the first magnet, the first magnet surrounding the water supply line, for providing cooling water to the first magnet.

5. The elementary plasma source of claim 3, further comprising a water inlet extending from a top of the second chamber to a bottom of the second magnet, for providing cooling water between an inner wall of the second chamber and the second magnet.

6. The elementary plasma source of claim 3, further comprising a circulator connected to the guide, for blocking reflected microwaves and transferring applied microwave power to the guide.

7. An apparatus for generating a plasma, comprising:
   a plurality of elementary plasma sources, each having a first hollow cylinder-shaped magnet, a second hollow cylinder-shaped magnet positioned around the first magnet, for forming a magnetic trap between the first and second magnets, and a guide for providing microwaves to a space between the first and second magnets; and
   at least one power splitter for splitting the microwaves applied to an input terminal and outputting the split microwaves to output terminals, thereby distributing the microwaves to the elementary plasma sources.

8. The apparatus of claim 7, wherein a plurality of power splitters are connected to each other in a tree structure, so that the microwaves applied to an uppermost input terminal is sequentially split and output to the lowermost output terminals connected to the elementary plasma sources.

* * * * *